United States Patent
Raghunathan et al.

(10) Patent No.: US 9,760,534 B2
(45) Date of Patent: *Sep. 12, 2017

(54) OPTIMAL PARAMETER SELECTION AND ACCELERATION IN ADMM FOR MULTI-STAGE STOCHASTIC CONVEX QUADRATIC PROGRAMS

(71) Applicant: Mitsubishi Electric Research Laboratories, Inc., Cambridge, MA (US)

(72) Inventors: Arvind Raghunathan, Brookline, MA (US); Stefano Di Cairano, Somerville, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 474 days.

This patent is subject to a terminal disclaimer.

(21) Appl. No.: 14/475,989

(22) Filed: Sep. 3, 2014

(65) Prior Publication Data

US 2015/0234780 A1    Aug. 20, 2015

Related U.S. Application Data

(63) Continuation-in-part of application No. 14/185,024, filed on Feb. 20, 2014.

(51) Int. Cl.
  *G06F 7/60*  (2006.01)
  *G06F 17/10*  (2006.01)
  (Continued)

(52) U.S. Cl.
  CPC ............ *G06F 17/11* (2013.01); *G05B 13/026* (2013.01); *G06F 17/50* (2013.01)

(58) Field of Classification Search
  None
  See application file for complete search history.

(56) References Cited

U.S. PATENT DOCUMENTS 7,328,074 B2  2/2008  Das et al.
8,600,525 B1  12/2013  Mustafa et al.
(Continued)

OTHER PUBLICATIONS

Mulvey, John M. et al, "A New Scenario Decomposition Method for Large-Scale Stochastic Optimization", May-Jun. 1995, Operations Research vol. 43, No. 3, Informs.*

(Continued)

*Primary Examiner* — Cedric D Johnson
(74) *Attorney, Agent, or Firm* — Gene Vinokur; James McAleenan; Hironori Tsukamoto

(57) ABSTRACT

A method solves a stochastic quadratic program (StQP) for a convex set with a set of general linear equalities and inequalities by an alternating direction method of multipliers (ADMM). The method determines an optimal solution, or certifies that no solution exists. The method optimizes a step size $\beta$ for the ADMM. The method is accelerated using a conjugate gradient (CG) method. The StMPC problem is decomposed into two blocks. The first block corresponds to an equality constrained QP, and the second block corresponds to a projection onto the StMPC inequalities and anticipativity constraints. The StMPC problem can be decomposed into a set of time step problems, and then iterated between the time step problems to solve the decoupled problems until convergence.

18 Claims, 7 Drawing Sheets

(51) Int. Cl.
*G06F 17/11* (2006.01)
*G05B 13/02* (2006.01)
*G06F 17/50* (2006.01)

(56) References Cited

U.S. PATENT DOCUMENTS

| | | | |
|---|---|---|---|
| 2006/0282177 A1 | 12/2006 | Fuller et al. | |
| 2012/0281929 A1 | 11/2012 | Brand et al. | |
| 2013/0018517 A1* | 1/2013 | Kalagnanam | G06Q 50/06 700/291 |
| 2014/0089759 A1* | 3/2014 | Draper | H04L 1/0045 714/766 |

OTHER PUBLICATIONS

Yang, Sen et al., "An Efficient ADMM Algorithm for Multidimensional Anisotropic Total Variation Regulation Problems", Aug. 11-14, 2013, KDD'13, ACM.*

Boyd, Stephen et al., "Distributed Optimization and Statistical Learning via the Alternating Direction Method of Multipliers", 2011, Foundations and Trends in Machine Learning, vol. 3, No. 1.*

Muske, Kenneth R. "Lagrangian Quadratic Programming Approach for Linear Model Predictive Control", May 8-10, 2002, Proceedings of the American Control Conference, AACC.*

Liang, Ximing et al., "Applying Infeasible Interior Point Method to SQP for Constrained Nonlinear Programming", 2008, International Conference on Computer Science and Software Engineering, IEEE.*

S. Boyd, N. Parikh, E. Chu, and J. Eckstein, "Distributed optimization and statistical learning via the alternating direction method of multipliers, Foundations and Trends in Machine Learning, vol. 3, No. 1, p. 1-122, 2011.

C. Garcia, D. Prett, and M. Moran, "Model predictive control: Theory and practice," Automatica(Oxford), vol. 25, No. 3, pp. 335-348, 1989.

Kögel et al., "Fast predictive control of linear, time-invariant systems using an algorithm based on the fast gradient method and augmented Lagrange multipliers," CCA 2011: 780-785, 2011.

O'Donoghue, "A splitting method for optimal control," IEEE Trans., IEEE Transactions on Control Systems Technology, 21(6):2432-2442, Nov. 2013. (to appear), 2013.

Rockafellar, "Monotone operators and the proximal point algorithm," SIAM J. Control Opt., vol. 14, pp. 877-898, 1976.

Richter et al., "Computational Complexity Certification for Real-Time MPC With Input Constraints Based on the Fast Gradient Method," IEEE Trans. Automat. Contr. 57(6): 1391-1403, 2012.

* cited by examiner

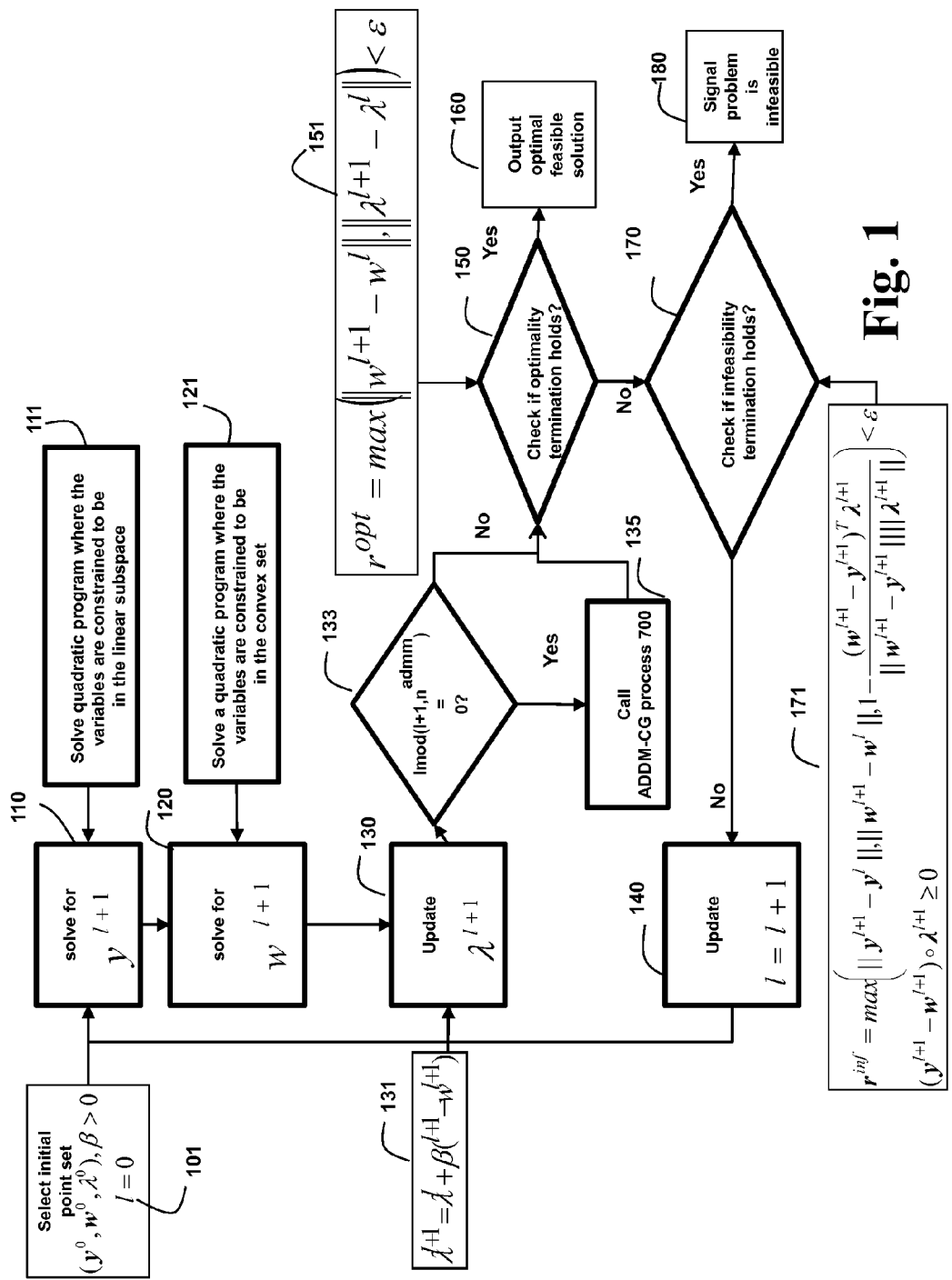

OPTIMAL PARAMETER SELECTION AND ACCELERATION IN ADMM FOR MULTI-STAGE STOCHASTIC CONVEX QUADRATIC PROGRAMS

RELATED APPLICATION

This is a Continuation-in Part application of U.S. patent application Ser. No. 14/185,024, "Method for Solving Quadratic Programs for Convex Sets with Linear Equalities by an Alternating Direction Method of Multipliers with Optimized Step Sizes," filed by Raghunathan et al. on Feb. 20, 2014.

FIELD OF THE INVENTION

The invention relates generally to solving a multi-stage stochastic convex quadratic program (QP) for a convex set with linear equalities, and more particularly to solving the multi-stage stochastic convex QP by an Alternating Direction Method of Multipliers (ADMM).

BACKGROUND OF THE INVENTION

The Alternating Direction Method of Multipliers (ADMM), which is a variant of an augmented Lagrangian scheme, uses partial updates for dual variables to solve a quadratic program. The ADMM alternately solves for a first variable while holding a second variable fixed, and solving for the second variable while holding the first variable fixed, see Boyd et al. "Distributed optimization and statistical learning via the alternating direction method of multipliers," Foundations and Trends in Machine Learning, vol. 3, no. 1, p. 1-122, 2011. Rather than iterating until convergence as in the Lagrangian-augmented problem, which is possibly complex, the ADMM performs iterations of alternating steps of updates on subsets of the variables.

The ADMM is frequently used for solving structured convex quadratic programs (QP) in applications, such as for example, compressive sensing, image processing, machine learning, distributed optimization, regularized estimation, semi-definite programming, and real-time control and signal processing applications, to name but a few.

Of particular interest to the invention is the application of ADMM to model predictive control (MPC) problems for application to systems with uncertain parameters. MPC is a method for controlling constrained dynamical systems, such as robots, automotive vehicles, spacecrafts, HVAC systems, processing machines, by repeatedly solving a finite horizon optimal control formulated from a mathematical model of the system dynamics, constraints, and a user specified cost function. Uncertainty arises due to the presence of disturbances that affect the system dynamics or due to mismatch between the model of the system dynamics and the true system dynamics. When probability information can be associated to the uncertain values, a stochastic system is obtained.

For linear models of the systems with a quadratic cost function and subject to linear constraints, the MPC finite horizon optimal control problem can be formulated as a parametric QP. At every control cycle, a specific QP is generated from the parametric quadratic program and the current values of the system state, and possibly the current reference. Then, the QP is solved, and the first part of the control input sequence is applied as control input. At the following control cycle, a new optimization problem is solved from the updated system state. MPC has been increasingly applied to systems with fast dynamics where the MPC is implemented in a low computational power embedded processors.

U.S. Pat. No. 8,600,525 discloses an active set algorithm that can be used for solving MPC generated QP problems. U.S. Pat. No. 7,328,074 discloses a method of providing an active-set algorithm wherein an initial guess for an optimization problem is provided from the solution of a previous optimization. U.S. Publication 20060282177 discloses an interior point algorithm for solving quadratic programs that arise in the context of model predictive control of gas turbine engines.

However, the computational effort per iteration of those methods can be prohibitive for application to large scale problems. The complexity of the operations that are performed, such as the solution of large scale linear systems, makes them infeasible for the type of computing hardware commonly used in real-time control and signal processing applications.

Methods such as gradient methods and accelerated gradient methods cannot easily handle linear inequality constraints. Low complexity fast optimization methods have been developed for MPC. U.S. Publication 20120281929 discloses a method for solving quadratic programs with non-negative constraints and a method to optimize such method for application to MPC.

A fast gradient algorithm is described for an application to MPC by Richter et al., "Computational Complexity Certification for Real-Time MPC With Input Constraints Based on the Fast Gradient Method," IEEE Trans. Automat. Contr. 57(6): 1391-1403, 2012.

A Lagrangian method for MPC is described by Kögel et al., "Fast predictive control of linear, time-invariant systems using an algorithm based on the fast gradient method and augmented Lagrange multipliers," CCA 2011: 780-785, 2011.

However, those methods are limited in the application by the types of constraints that can be handled, e.g., Richter et al., or can only handle input constraints, or need to perform division operations, e.g., in U.S. Publication 20120281929, which are time consuming in the computing hardware for MPC, or by complex iteration, e.g., Kögel et al. This is mainly due to the need of achieving the solution of the Lagrangian-augmented problem, which is complex due to the presence of constraints, before updating the Lagrange multipliers, multipliers at every update.

Thus, there is a need to provide a method that can solve large scale problems with small computational complexity per iteration, rapid convergence when problems are feasible, and quick detection of infeasibility.

SUMMARY OF THE INVENTION

The invention relates to finding solution of stochastic quadratic programs (StQPs) wherein constraints are linear and the objectives are quadratic and depend on uncertain parameters.

StQPs arise in the fields of financial planning, inventory management among others. Of particular interest is the application of quadratic stochastic programming to model predictive control of machines and manufactoring processes and plants.

The embodiments of the invention provide a method for solving a stochastic quadratic programs (StQP) for a convex set with a set of general linear equalities and inequalities by an alternating direction method of multipliers (ADMM). The invention relates to solution of Stochastic Quadratic Programs (StQPs) wherein the constraints are linear, objective is quadratic and the constraints and objective depend on uncertain parameters.

The method of the invention determines an optimal solution, or alternatively certifies that no solution to the problem exists. The embodiments also provide a method for optimizing a step size $\beta$ for the ADMM, which achieves convergence with the least number of iterations. The embodiments also provide a method for accelerating the convergence of the ADMM using conjugate gradient (CG) method.

Of special interest is the application of ADMM to StQPs that are solved for Stochastic Model Predictive Control (StMPC), where inequalities represent constraints on states and controls of a dynamic system, and the equalities represent the equations of the system dynamics that couple the variables of the optimization problem. The stochasticity in MPC arises from uncertain parameters in the system dynamics arising from disturbances or plant-model mismatch when probability information on the uncertain parameters is available. A uniform probability on the uncertain values may be assumed to solve an MPC problem with uncertain parameters and no probability information by StMPC.

In StMPC, the uncertain parameters are typically sampled to obtain a finite set of realizations. The optimization is performed over the finite set of realization to obtain optimal control action that in expectation is optimal over all the realizations of the uncertain parameters. A StMPC problem formulation is an instance of a StQP.

Prior art methods are known for minimizing the QP while satisfying linear equalities and the convex set. For example, active set methods and interior point methods are the most common iterative methods. The embodiments use such methods to solve the StQP.

The embodiments of the invention overcome the difficulties of prior art methods by performing only simple operations in iterations, in contrast with U.S. Pat. Nos. 8,600,525, 7,328,074, an U.S. Publication 20060282177. The embodiments do not involve divisions as in U.S. Publication 20120281929, and perform low complexity iterations by alternatively updating subsets of Lagrange multipliers by single iterations, rather than updating the entire set of multipliers, thus operating only on simple constraints.

The embodiments provide the optimal selection for the step size $\beta$ of the ADMM iterations, which minimizes the number of iterations performed by the method to a least number, and hence achieves the maximal rate of execution for a StMPC controller implemented in a given computing hardware.

In one embodiment, the StMPC problem is decomposed into two blocks. The first block corresponds to an equality constrained QP, and the second block corresponds to a projection onto the StMPC inequalities and anticipativity constraints. The StMPC problem can also be decomposed into a set of time step problems, and then iterated between the time step problems to solve the decoupled problems until convergence.

Furthermore, the embodiments allow for an early and effective detection of infeasibility, meaning that the method, on termination, certifies that no solution exists for the QP problem. The embodiments also described a solution that minimizes violations of the constraints.

BRIEF DESCRIPTION OF THE DRAWINGS

FIG. 1 is a flow diagram of a method for solving a quadratic program by an alternating direction method of multipliers (ADMM) according to embodiments of the invention;

DETAILED DESCRIPTION OF THE PREFERRED EMBODIMENTS

Controller and Machine

Figure 3:
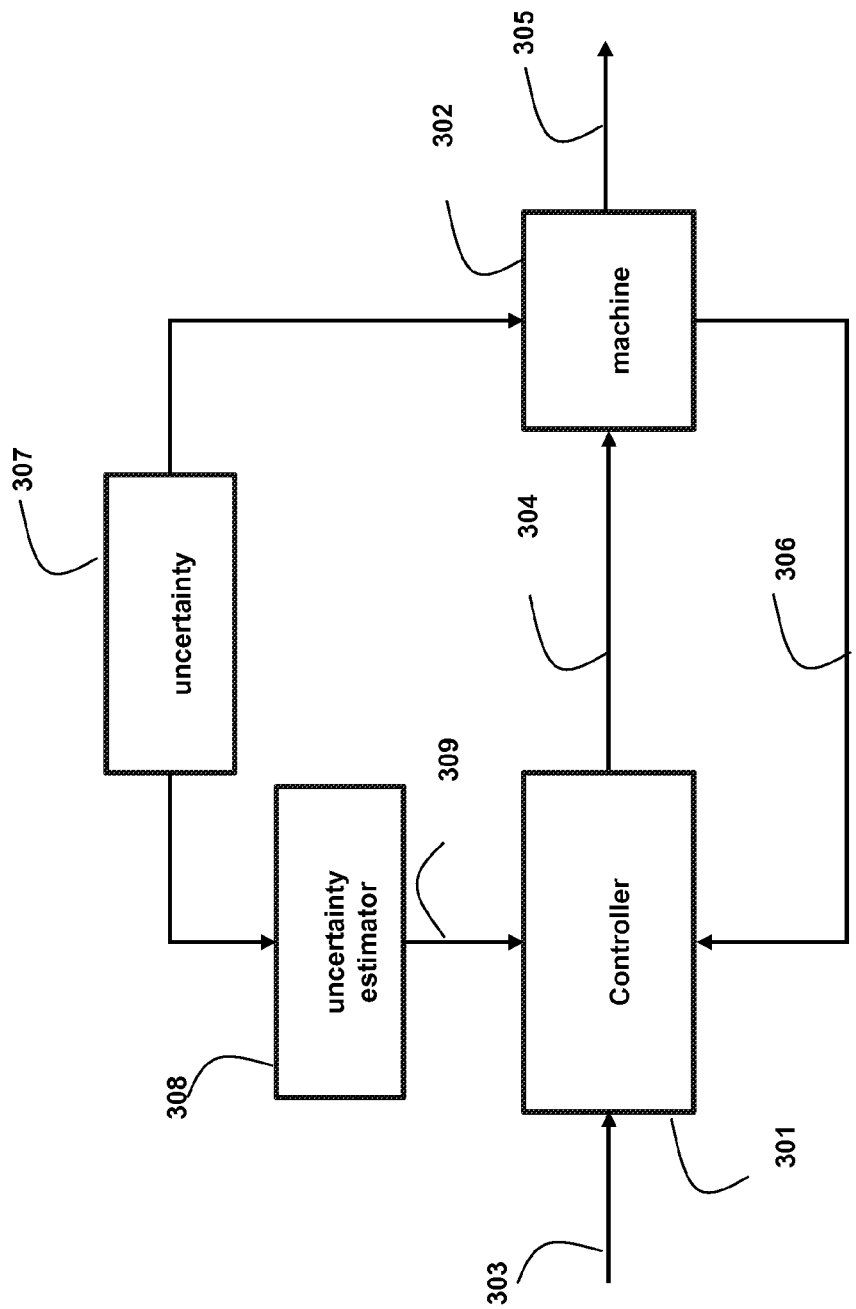
FIG. 3 is a block diagram of a controller and machine using the ADMM according to embodiments of the invention.

FIG. 3 shows a controller 301 and a machine 302 using alternating direction method of multipliers (ADMM) according to embodiments of the invention. Of particular interest to the invention is the application of ADMM to model predictive control (MPC) problems with uncertain parameters, herein called the Stochastic MPC (StMPC).

The term "machine" is used generally because it is well understood that MPC has been used for decades in chemical and oil refineries. Generally, models used in MPC are intended to represent the behavior of complex dynamical systems. The additional computations of the MPC is generally not needed to provide adequate control of simple systems, which are often controlled well by proportional integral-derivative PID controllers.

Common dynamic characteristics that are difficult for PID controllers include large time delays, constraints, multiple control inputs, and high-order dynamics. MPC models predict the change in the dependent variables of the modeled system that will be caused by changes in the independent variables. For example, in a chemical process, independent variables that can be adjusted by the controller are often either the setpoints of regulatory PID controllers (pressure, flow, temperature, etc.) or the final control element (valves, dampers, etc.). Independent variables that cannot be adjusted by the controller are used as disturbances. Dependent variables in these processes are other measurements that represent either control objectives or process constraints.

Stochastic Model Predictive Control (StMPC)

Stochastic model predictive control (StMPC) is a process for controlling systems subject to stochastic uncertainty. As shown for example in FIG. 3, the machine 302 that is to be controlled is subject to an uncertainty 307, and receives an input 304. The input is generated by the controller 301 so that the machine output 305 follows a desired behavior 303, using feedback from a machine state 306 and an estimate of the uncertainty 309 obtained possibly by an uncertainty estimator 308. In StMPC, the behavior of the machine subject to uncertainty is described by a linear stochastic difference Equation $$x(t+1)=A_m(w(t))x(t)+B_m(w(t))u(t)+G_m(w(t))$$

$$p(w(t))=f_p(w(t-1),\ldots,w(t-t_w)), \quad (1)$$

where $x \in \Re^{n_x}$ is the difference Equation state which contains the machine state and information of the desired behavior of the machine, $u \in \Re^{n_u}$ is the input, $w \in \Re^{n_w}$ is a stochastic vector that represents the uncertainty, possibly with a finite discrete set of values allowed, p is a probability distribution function, $f_p$ is a function that describes p, $t_w$ is a length of time steps t that defines the probability distribution, and $A_m$, $B_m$, $G_m$ are parameters of the model.

The states and inputs of the system whose behavior is described in Equation (1) can be subject to constraints $$x(t+k) \in X_{k|t}, u(t+k) \in U_{k|t}, \quad (2)$$

where $X_{k|t}$, $U_{k|t}$ are admissible sets for state and input, respectively. St MPC selects the control input by solving the optimal control problem formulated from Equations (1) and (2) as $$\min_{u_t} E\left[x_{N|t}^T P x_{N|t} + \sum_{k=0}^{N} x_{k|t}^T Q x_{k|t} + u_{k|t}^T R u_{k|t}\right] \quad (3)$$

$$\text{s.t. } x_{k+1|t} = A_m(w(t+k))x_{k|t} + B_m(w(t+k))u_{k|t} + G_m(w(t+k))$$

$$p(w(t+k)) = f_p(w(t+k-1), \Box, w(t+k-t_w))$$

$$x_{k|t} \in X_{k|t}, u_{k|t} \in U_{k|t}$$

$$x_{0|t} = x(t),$$

where $a_{k|t}$ is a predicted value of a generic vector a for k steps ahead of t, T is a transpose operator, Q and P are positive semidefinite matrices, R is a positive definite matrix, the positive integer N is a MPC prediction time horizon, and $u_t=(u_{0|t},\ldots,u_{N-1|t})$ is the control policy.

In the problem described by Equation (3), x is a random vector due to the effect of w. Hence, the problem is difficult to solve in such form.

Scenario-Enumeration Stochastic MPC Control

Figure 4:
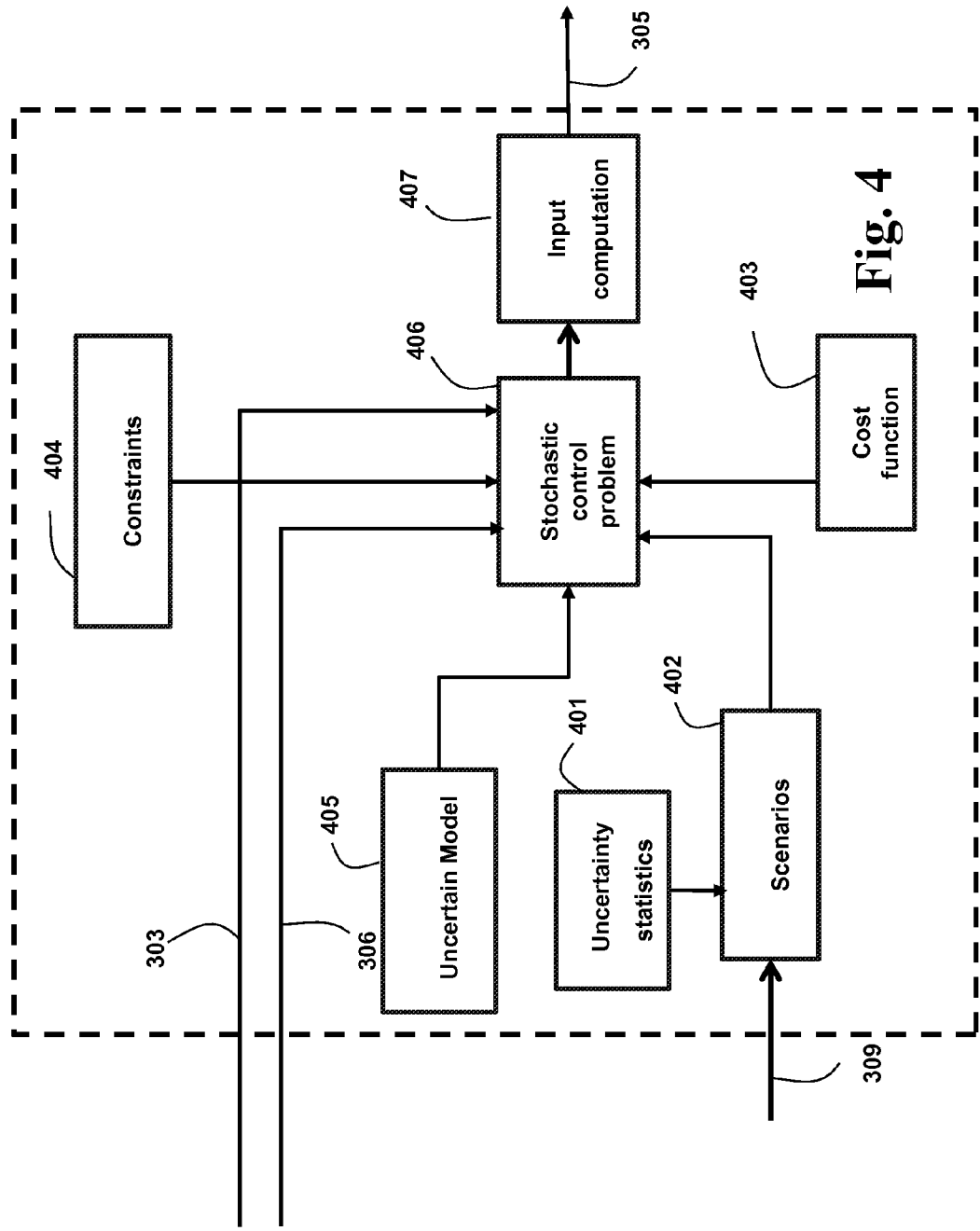
FIG. 4 is a block diagram of the controller using the ADMM according to embodiments of the invention.

Scenario-enumeration stochastic MPC control operates as described for FIG. 4. The stochastic optimal control problem 406 is formulated from an uncertain machine model 405, and a set of scenarios 402, which are computed from uncertainty statistics 401, and possibly from a current estimate of the uncertainty 309. Scenario information 402 is used in conjunction with the cost function 403 to formulate the stochastic control problem 406, which uses constraints 404, the machine feedback 306 and the machine desired behavior 303. Then, the stochastic optimal control problem 406 is solved during input computation 407, from which the machine input 305 is determined.

Scenarios

Figures 5A, 5B:
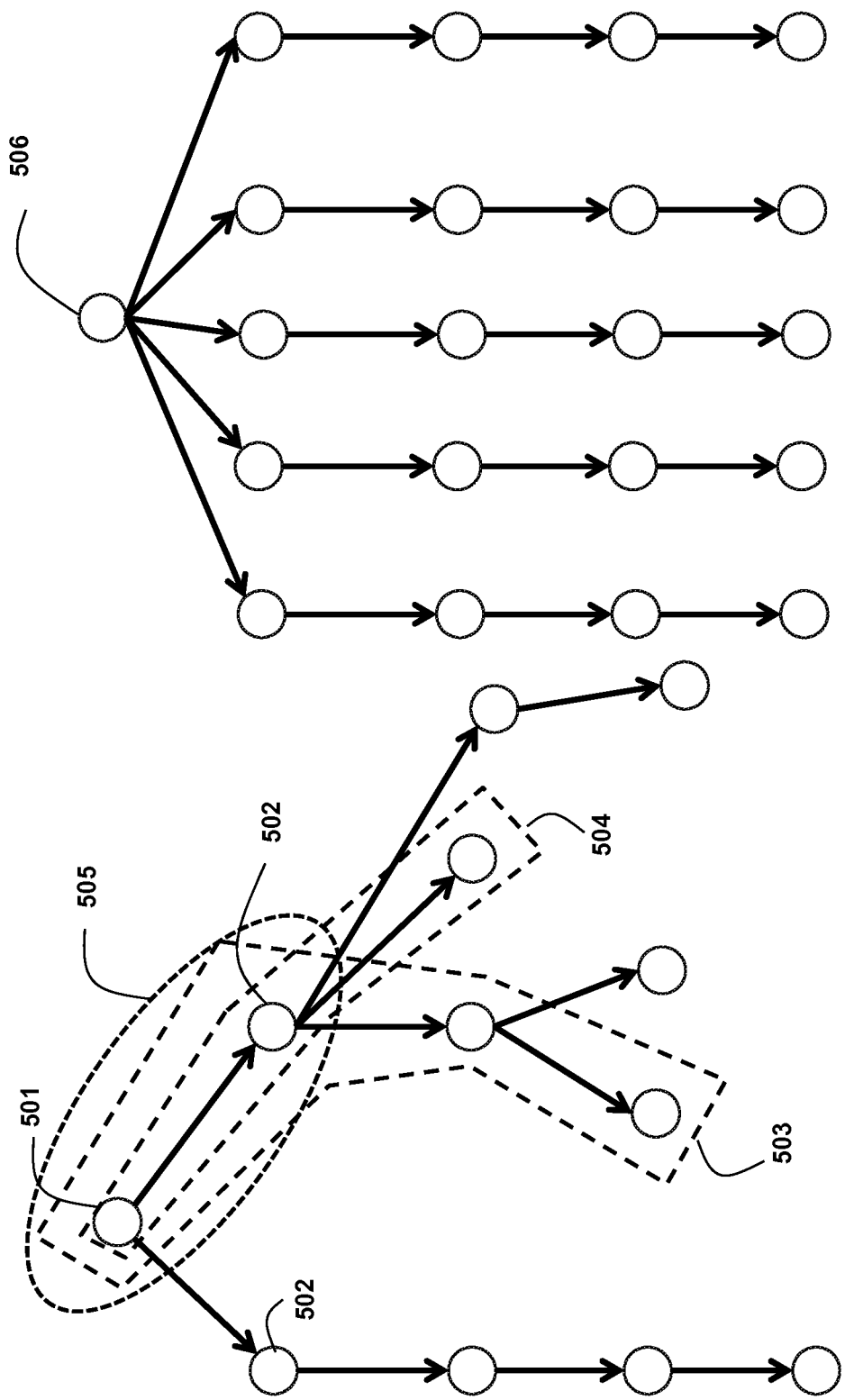
FIGS. 5A and 5B are schematics of scenario generation for stochastic MPC control according to embodiments of the invention.

The scenarios are sequences of possible realizations w, i.e., $$s_{k|t}(j)=[w_{0|t}^j \ldots w_{N-1|t}^j],$$

and to each scenario, a probability $\pi(s_{k|t}(j))$ can be associated via p and $f_p$. The scenarios can be generated as described for FIGS. 5A and 5B. From a current estimate w(t) of the uncertainty 501 $r_1$ possible values for the future uncertainty are selected $w_{0|t}^j$, j=1, ... $r_1$ for instance based on their likelihood as described by the function $f_p$. These values are assigned to the nodes 502. Then, the process is repeated from every node. A scenario is a sequence of connected nodes 503 and 504. The scenarios can share an initial part, such as 505 shared between 503 and 504. The scenarios can have different lengths, and the number of nodes generated from a previous node can change. A particular case is shown in FIG. 5B where r same length scenarios are generated from a single 506 node. The scenarios only share the initial node 506.

Stochastic MPC

Figure 6:
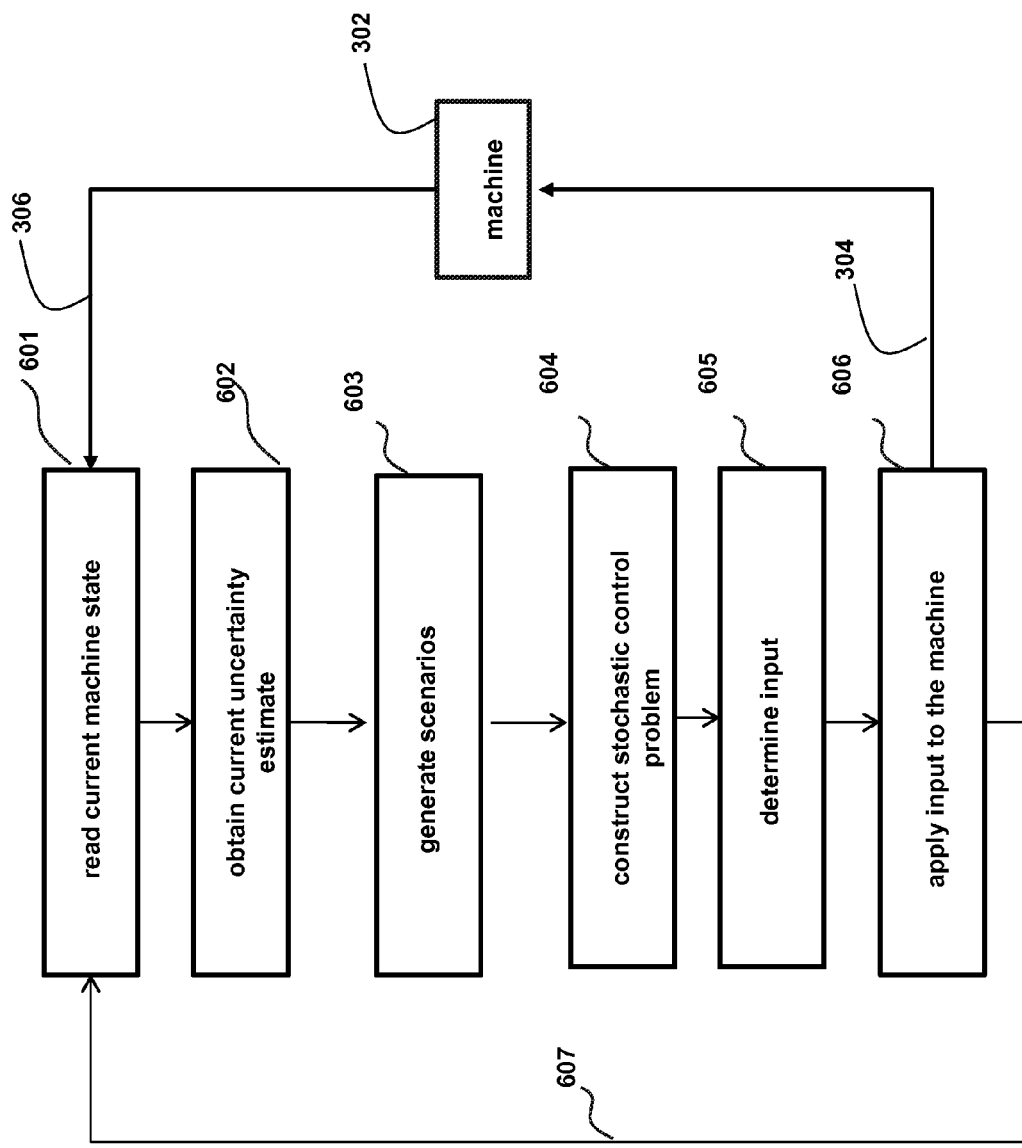
FIG. 6 is a flow diagram of stochastic MPC based on scenario enumeration according to embodiments of the invention.

The stochastic MPC based on scenario enumeration is described for FIG. 6. A current state 306 of the machine is read 601, and a current estimate of the uncertainty is obtained 602, the scenarios are generated 603, the stochastic optimal control problem is constructed 604, and solved to determined 605 the input. The computed input 304 is applied 606 to the machine and the cycle is repeated 607 when a new machine state is available.

In scenario-enumeration MPC for $N_r$ scenarios, which is a subset of the possible scenarios on the MPC prediction horizon, the scenario-enumeration stochastic MPC problem is formulated as $$\min_{\{x_t^r, u_t^r\}_{r=1}^{N_r}} \sum_{r=1}^{N_r} \pi(s_{k|t}(r))\left[(x_{N|t}^r)^T P x_{N|t}^r + \sum_{k=0}^{N-1} (x_{k|t}^r)^T Q x_{k|t}^r + (u_{k|t}^r)^T R u_{k|t}^r\right] \quad (4)$$

$$\text{s.t. } x_{k+1|t}^r = A_m(w_{k|t}^r) x_{k|t}^r + B_m(w_{k|t}^r) u_{k|t}^r + G_m(w_{k|t}^r)$$

$$\forall r = 1, \ldots, N_r, k = 0, \ldots, N-1$$

$$x_{k+1|t}^r \in X_{k+1|t}, u_{k|t}^r \in U_{k|t}$$

$$\forall r = 1, \ldots, N_r, k = 0, \ldots, N-1$$

$$x_{0|t}^r = x(t) \forall r = 1, \ldots, N_r$$

$$w_{0|t}^r = w(t) \forall r = 1, \ldots, N_r$$

$$u_{k|t}^{r^{min}(k)} = u_{k|t}^r, \forall r \neq r^{min}(k), r \in R_{k|t} \text{ and } r^{min}(k) = \min(R_{k|t}).$$

where $x_t^r=(x_{1|t}^r \ldots x_{N|t}^r)$, $u_t^r=(u_{0|t}^r \ldots u_{N-1|t}^r)$, and $R_{k|t}$ is the set of all scenarios, which are equal from the beginning until the step k−1, that is, $$r, r' \in R_{k|t} \Leftarrow s_{k'|t}(r)=s_{k'|t}(r') \forall k'=0, \ldots, k-1.$$

Due to the scenario enumeration, all vectors in Equation (4) are now deterministic, so that Equation (4) can be formulated as $$\min_{\{y_r\}_{r=1}^{N_r}} \sum_{r=1}^{N_r} \left(\frac{1}{2} y_r^T Q_r y_r + q_r^T y_r\right) \quad (5)$$

$$\text{s.t. } A_r y_r = b_r \forall r = 1, \ldots, N_r$$

$$y_r \in Y_r \forall r = 1, \ldots, N_r$$

$$\bar{y}_k^{r^{min}(k)} = \bar{y}_k^r \forall r \neq r^{min}(k), r \in R_{k|t} \text{ and } r^{min}(k) = \min(R_{k|t}),$$

where for each scenario r=1, ..., $N_r$, $k^{max}(r)$ is the largest index for which $r \in R_{k^{max}(r)|t}$. The variables $\bar{y}_k^r$ are called the non-anticipativity constrained variables. Note that, $k^{max}(r)$ ≥0, which means that at a minimum the control at the current time t must be equated across all scenarios and $$y_r = (y^r, \bar{y}_0^r, \ldots, \bar{y}_k^r \max_{(r)}), \quad y^r = (x_t^r = u_t^r), \quad q_r = 0$$

$$\Pi_x^r = \begin{pmatrix} \pi(s_{1|t}(r)) & & 0 \\ & \ddots & \\ 0 & & \pi(s_{N-1|t}(r)) \end{pmatrix}$$

$$\Pi_u^r = \begin{pmatrix} \pi(s_{0|t}(r)) & & 0 \\ & \ddots & \\ 0 & & \pi(s_{N-1|t}(r)) \end{pmatrix}$$

$$Q_r = \begin{pmatrix} \Pi_x^r \otimes Q & 0 & 0 & 0 \\ 0 & \pi(s_{k|t}(r))P & 0 & 0 \\ 0 & 0 & \Pi_u^r \otimes R & 0 \\ 0 & 0 & 0 & 0 \end{pmatrix}$$

$$b = \begin{pmatrix} A_m(w_{0|t}^r)x(t) + G_m(w_{0|t}^r) \\ G_m(w_{1|t}^r) \\ \vdots \\ G_m(w_{N-1|t}^r) \\ 0 \\ \vdots \\ 0 \end{pmatrix} \right\} n_u(k^{max}(r)+1) \text{times}$$

$$Y_r = \underbrace{X_{1|t} \times \ldots X_{N|t} \times U_{0|t} \times \ldots U_{N-1|t}}_{=:\bar{Y}_r} \times R^{n_u(k^{max}(r)+1)}.$$

The matrix $A_r$ is defined so that, $$A_r = \begin{pmatrix} \hat{A}_r & \hat{B}_r & 0 \\ 0 & (-I_{n_u(k^{max}(r)+1)} \quad 0) & I_{n_u(k^{max}(r)+1)} \end{pmatrix}$$

where, $$\hat{A}_r = \begin{pmatrix} I_{n_x} & 0 & \ldots & 0 & 0 \\ -A_m(w_{1|t}^r) & I_{n_x} & \ldots & 0 & 0 \\ \vdots & \vdots & \ddots & \vdots & \vdots \\ 0 & 0 & \ldots & I_{n_x} & 0 \\ 0 & 0 & \ldots & -A_m(w_{N-1|t}^r) & I_{n_x} \end{pmatrix}$$

and, $$\hat{B}_r = \begin{pmatrix} -B_m(w_{0|t}^r) & \ldots & 0 \\ & \ddots & \\ 0 & \ldots & -B_m(w_{N-1|t}^r) \end{pmatrix},$$

$I_{n_u(k^{max}(r)+1)}$ is an identity matrix of size $n_u(k^{max}(r)+1) \times n_u(k^{max}(r)+1)$.

Scenario Decomposition-Based ADMM

As shown in FIG. 1, the embodiments of the invention provide a method for solving a quadratic program (QP) for a convex set with general linear equalities and inequalities by an alternating direction method of multipliers (ADMM). The method optimizes the step size β of the ADMM to minimize the number of required iterations thus minimizing the amount of time of the processor needed to obtain the solution.

In one embodiment of the invention, the quadratic program (5) resulting from scenario-enumeration stochastic MPC problem can be reformulated as, $$\min_{\{y_r\}_{r=1}^{N_r}} \sum_{r=1}^{N_r} \left( \frac{1}{2} y_r^T Q_r y_r + q_r^T y_r \right) \quad (6)$$

$$\text{s.t.} \quad A_r y_r = b_r \forall r = 1, \ldots, N_r,$$

$$y \in Y_{sd}$$

where a convex set $Y_{sd}$ is defined as $$Y_{sd} = \left\{ (y_1, \ldots, y_{N_r}) \middle| \begin{array}{l} y_r \in Y_r \forall r = 1, \ldots, N_r \\ \bar{y}_k^{min}(k) = \bar{y}^{r'min}(k) \forall r \neq r_k, r \in R_{k|t} \\ \text{and } r^{min}(k) = \min(R_{k|t}) \end{array} \right\}. \quad (7)$$

Convex Sets

Figure 2B:
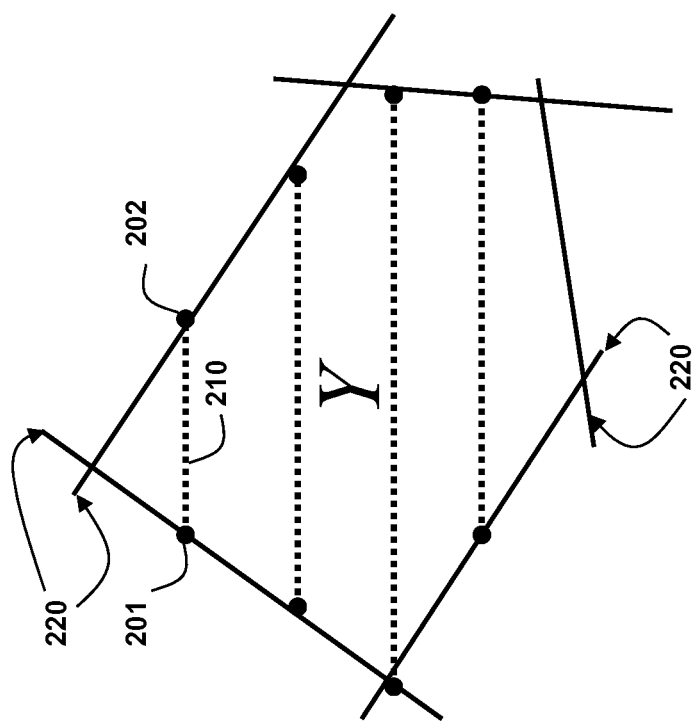
FIG. 2B is a schematic of a convex region Y defined as hyperplanes that can be solved by embodiments of the invention.
Figure 2A:
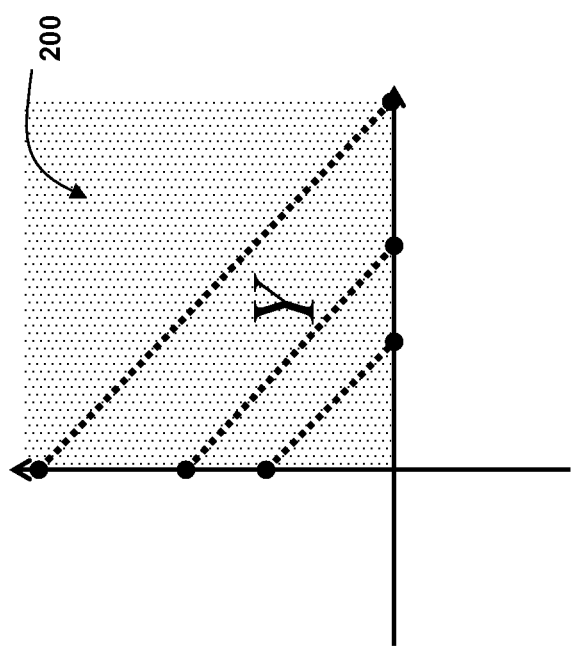
FIG. 2A is a schematic of a convex set Y defined as a non-negative orthant that can be solved by embodiments of the invention.

FIGS. 2A and 2B show example convex sets Y that can be solved by the embodiments of the invention. In a Euclidean space, a set is convex when, for every pair of points 201-202 in the set, every point on a straight line segment 210 that joins the pair of points is also in the set. Specifically, FIG. 2A shows a convex set Y 200 defined as a non-negative orthant 200. FIG. 2B is a schematic of a convex set Y defined as hyperplanes 220. Observe that non-anticipativity constraints are included in the convex set $Y_{sd}$.

Consider reformulating Equation (6) as, $$\min_{y,w} \sum_{r=1}^{N_r} \left( \frac{1}{2} y_r^T Q_r y_r + q_r^T y_r \right) \quad (8)$$

$$\text{s.t.} \quad A_r y_r = b_r \forall r = 1, \ldots, N_r,$$

$$y = w, w \in Y_{sd}$$

where $y=(y_1, \ldots, y_{N_r}) \in \Re^n$ with $n=N_r(n_x+n_u+n_u(k^{max}(r)+1))$. The variables $w \in \Re^n$ are required to be in the convex set $Y_{SD}$. The advantage of Equation (8) is that the inequalities and the scenario coupling non-anticipativity constraints are placed on separate variables w, coupled with the others by y=w. The variables y is the linear subspace constrained variables, and w will be called the convex set constrained variables.

The ADMM procedure dualizes the constraints $y_r=w_r$ into the objective function using scaled multipliers $\beta_r, \lambda_r$, respectively where $\beta_r > 0$. Additionally, the objective is also augmented with a penalty on the squared norm of the violation of the dualized equality constraints. Thus, we obtain $$\min_{y,w} \sum_{r=1}^{N_r} L_r(y_r, w_r, \lambda_r) \quad (9)$$

$$\text{s.t.} \quad A_r y_r = b_r \forall r = 1, \ldots, N_r,$$

$$w \in Y_{sd}$$

where $$L_r(y_r, w_r, \lambda_r) := \frac{1}{2} y_r^T Q_r y_r + q_r^T y_r + \frac{\beta_r}{2} \|y_r - w_r - \lambda_r\|^2. \quad (10)$$

In Equation (9), w and y are coupled only by the objective function. The steps 110, 120, 130 and 140 in the ADMM procedure respectively are:

$$y^{l+1} = \operatorname*{argmin}_y \sum_{r=1}^{N_r} L_r(y_r, w_r^l, \lambda_r^l) \quad (11)$$

$$\text{s.t.} \quad A_r y_r = b_r \forall r = 1, \ldots, N_r$$

$$w^{l+1} = \operatorname*{argmin}_w \sum_{r=1}^{N_r} L_r(y_r^{l+1}, w, \tilde{\lambda}_r^l) \quad (12)$$

$$\text{s.t.} \quad w \in Y_{sd}$$

$$\lambda^{l+1} = \lambda^l + w^{l+1} - y^{l+1}. \quad (13)$$

The update step 140 of $\lambda$ in Equation (13) scales linearly in the number of scenarios. We show in the following that Equations (11) and (12) also decouple by scenarios.

Observe that the objective functions and constraints in Equation (11) are decoupled by scenarios. Hence, the update 111 can be rewritten as, $$y_r^{l+1} = M_r(w_r^l + \lambda_r^l - q_r/\beta_r) + N_r b_r$$

where, $$M_r := Z_r(Z_r^T(Q_r/\beta_r + I_n)Z_r)^{-1}Z_r^T,$$

$$N_r := (I_n - M_r Q_r/\beta_r)R_r(A_r R_r)^{-1}, \quad (14)$$

with $R_r, Z_r$ denote an orghonormal basis for the range space of $A_r^T$ and null space of $A_r$, respectively. Thus, the update for y decouples by scenario and scales linearly with the number of scenarios.

In (12), the objective function is component wise separable in the w. Using $w_r = (w_r, \overline{w}_r)$ the constraint set $w \in Y_{sd}$ can be posed as, $$w^r \in Y_r \forall r = 1, \ldots, n_r \text{ and}$$

$$\overline{w}_k^{r^{min}(k)} = \overline{w}_k^r \forall r \ne r^{min}(k), r \in R_{k|t} \text{ and } r^{min}(k) = \min(R_{k|t}) \quad (15)$$

Note that $\overline{w}_r$ are only constrained by the equality of the values across scenarios and are not limited by bounds. Hence, the update 121 in (12) can be obtained as $$w_r^{l+1} = P_Y((y^r)^{l+1} - (\lambda^r)^l) \quad (16)$$

$$(\overline{w}_k^r)^{l+1} = \frac{1}{|R_{k|t}|} \sum_{r' \in R_{k|t}} ((\overline{y}_k^{r'})^{l+1} - (\overline{\lambda}^{r'})^l) \forall k =, 0, \ldots, N-1, r \in R_{k|t}$$

where we have used $\lambda_r = (\lambda^r, \overline{\lambda}^r)$ and $P_Y(x)$ denotes the projection of vector x onto the set Y. Even though the set $Y_{sd}$ is not simple we can still compute the update for w in a manner that scales linearly in the number of scenarios.

Calling ADMM-CG

A check is made 133 to call the CG process every $n^{admm}$ iterations, where $n^{admm}$ is predetermined. If yes, then the CG process 700 is called 135. The ADMM-CG is explained in detail later in this invention. Otherwise, it is proceeded to step 150. The ADMM-CG procedure is described in greater detail later in this invention with reference to FIG. 7

Termination Condition

Step 150 checks if an optimality termination holds. Given a predetermined tolerance $\in$, a termination condition 151 for an optimal feasible solution 160 is $$r^{opt} = \max(\|w^{l+1} - w^l\|, \|\lambda^{l+1} - \lambda^l\|) < \in. \quad (17)$$

If the termination condition for the feasible solution is satisfied, then the optimal feasible solution is output 160. The termination condition 151 in Equation (17) checks for the satisfaction to the tolerance greater $\in$ greater than zero of a maximum of a norm of a change in the set constrained variable w from a current value to a value at a previous iteration, and a norm of the change in the Lagrange multiplier $\lambda$ from a current value to a value at a previous iteration.

Otherwise, for $\in > 0$, a termination condition 171 for certifying a solution to the problem is infeasibility is checked in step 170

$$r^{inf} = \max\left(\|y^{l+1} - y^l\|, \|w^{l+1} - w^l\|, 1 - \frac{(w^{l+1} - y^{l+1})^T \lambda^{l+1}}{\|w^{l+1} - y^{l+1}\| \|\lambda^{l+1}\|}\right) < \varepsilon \quad (18)$$

$$(y^{l+1} - w^{l+1}) \circ \lambda^{l+1} \ge 0$$

where $\circ$ denotes the element-wise multiplication of two vectors. If the termination condition for the infeasible solution is satisfied, then certification that the solution is infeasible can be signaled 180.

The termination condition 171 in Equation (18) is checked for the satisfaction of four conditions.

The first condition is a satisfaction to a tolerance $\in$ greater than zero of a maximum of a normed change in the set constrained variable vector w from a current value to a value at a previous iteration.

The second condition is the satisfaction to a tolerance $\in$ greater than zero of the normed change in the linear subspace constrained variable vector y from the current value to the value at the previous iteration.

The third condition checks for a deviation from 0 to a tolerance of not more than $\in$ of an angle between the Lagrange multiplier vector $\lambda$ and the vector resulting from a difference of the linear subspace constrained variable vector and the set constrained variable vector, i.e., (y−w), at the current value.

The fourth condition requires that a difference of the linear subspace constrained variable vector and the set constrained variable vector at the current value have, element-wise, an identical sign as the Lagrange multiplier vector. Otherwise, update 140 l=l+1, and perform the next iteration.

The general method can be implemented in a processor or other hardware as describe above connected to memory and input/output interfaces by buses as known in the art.

Optimal Parameter Choice

The choice of the step size $\beta_r$, which ensures that a least number of iterations are required for termination of the ADMM method is $$\beta_r^{opt} = \sqrt{\lambda_{min}(Z_r^T Q_r Z_r) \lambda_{max}(Z_r^T Q_r Z_r)}, \quad (19)$$

where $\lambda_{min}(\bullet), \lambda_{max}(\bullet)$ are minimal and maximal eigenvalues of contained matrix arguments. In other words, the optimal step size is determined as a square root of a product of minimum and maximum eigenvalues of a Hessian matrix of the scenarios problem pre- and post multiplied by an orthonormal basis for a null space of a linear equality constraint matrix.

In another embodiment of the invention, a single value of $\beta$ is chosen for all scenarios $\beta_r=\beta$. In this case, the optimal value of the parameter is prescribed as, $$\beta^{opt}=\sqrt[4]{\lambda_{min}(Z^TQZ)\lambda_{max}(Z^TQZ)}, \qquad (20)$$

where, Z is the orthonormal basis for the vectors satisfying the constraints, $$A_r y_r=0 \forall r=1,\ldots,N_r,$$

$$\bar{y}_k^{r^{min}(k)}=\bar{y}_k^{r} \forall r \neq r_k, r \in R_{k|t} \text{ and } r^{min}(k)=\min(R_{k|t})$$

and, $$Q = \begin{pmatrix} Q_1 & & 0 \\ & \ddots & \\ 0 & \ldots & Q_{N_r} \end{pmatrix}.$$

Scenario Decomposition and Conjugate Gradient (CG)-Based ADMM

Figure 7:
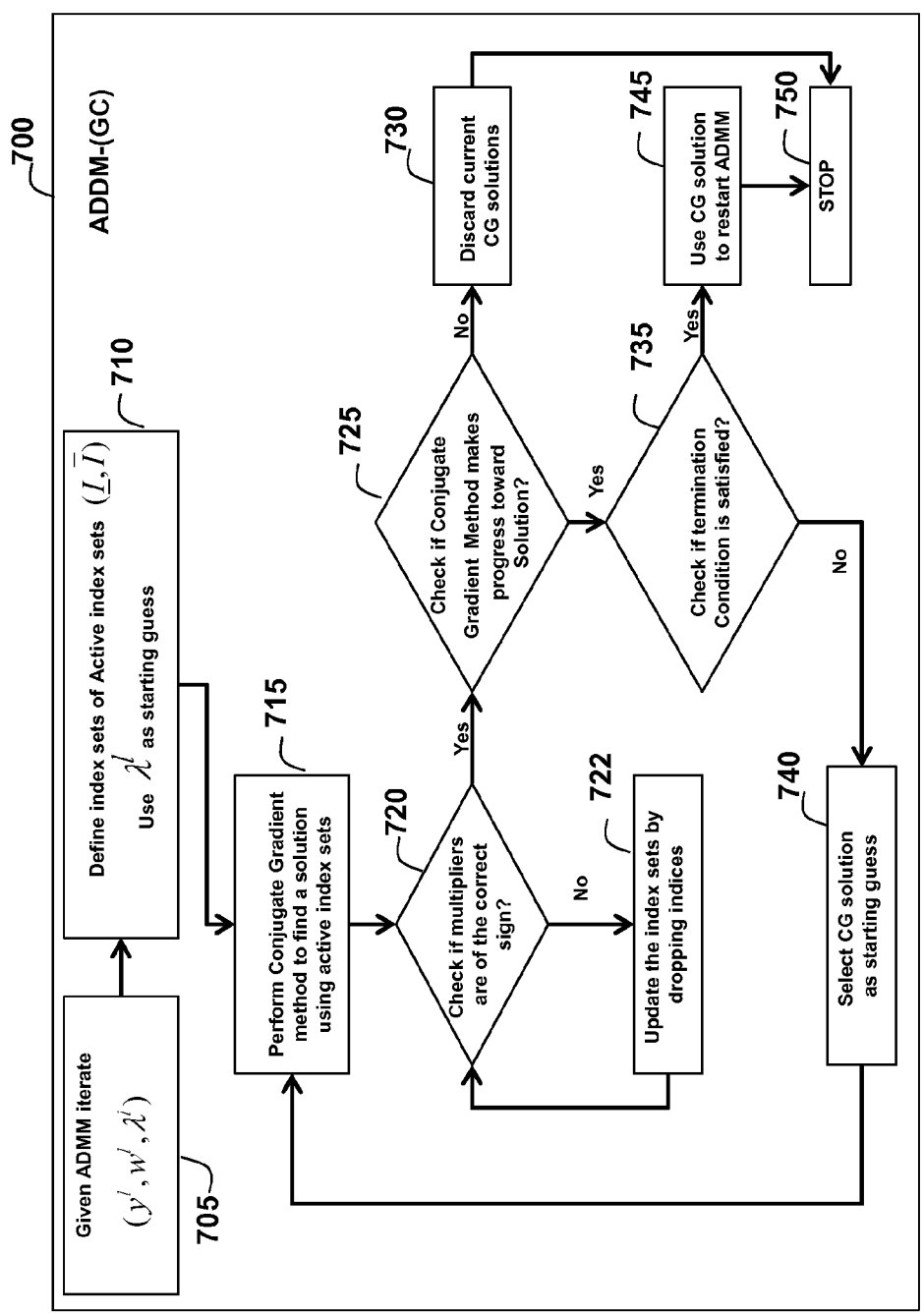
FIG. 7 is a flow diagram for a CG process to accelerate convergence of ADMM according to embodiments of the invention.

FIG. 7 describes the steps involved in the ADMM-CG process 700 used to accelerate the convergence of the ADMM iterations. For the purposes of simplifying this description, the following are assumed. It is understood that the techniques described herein can be extended identically to multi-stage stochastic programs: $Y_r=[\underline{y}^r,\bar{y}^r]$, where $\underline{y}^r$ is a vector of lower bounds and $\bar{y}^r$ is vector of upper bounds for $y^r$, and the scenarios are such that $R_{k|t}=\emptyset \forall k>1$. In other words, the MPC problem is a two-stage stochastic program. Hence, $$y_r=(y^r,\bar{y}_0^r), w_r=(w^r,\bar{w}_0^r), \lambda_r=(\lambda^r,\bar{\lambda}_0^r) \notin r=1,\ldots,N_r,$$

where $$(y^+,w^+,\lambda^+)=\text{ADMM}(y,w,\lambda) \qquad (40)$$

denotes one iteration of ADMM, that is application of Equations (11-13), where $(y^k, w^k, \lambda^k)=(y, w, \lambda)$, and the parameter $\beta_r=\beta$. For convenience, let $v^l=y^l-y^{l-1}$.

After every $n^{admm}$ iterations of the ADMM-CG process 700, as checked in step 133, defined by steps in Equation (11-13), the ADMM-CG process is called 135, see FIG. 1.

Identifying Linear Inequalities Expected to Hold as Equalities at Solution

Given an ADMM iterate $(y^l, w^l, \lambda^l)$ 705, we define the index sets 710 as $$\underline{I}_r = \{i \mid (w_i^r)^l = \underline{y}_i^r \text{ or } (\lambda_i^r)^l \geq \epsilon^{act}\} \qquad (21)$$

$$\bar{I}_r = \{i \mid (w_i^r)^l = \bar{y}_i^r \text{ or } (\lambda_i^r)^l \leq -\epsilon^{act}\}$$

$$\hat{y}_{r,i} = \begin{cases} \underline{y}_i^r & \text{if } i \in \underline{I}_r \\ \bar{y}_i^r & \text{if } i \in \bar{I}_r \\ 0 & \text{otherwise} \end{cases}$$

where $\epsilon^{act}$ is a tolerance for estimating the inequality constraints in the convex set that are expected to hold as equalities at the solution to the StQP, and $E_r$ is a matrix that extracts the components of $w^r$ that are in $\underline{I}_r \cup \bar{I}_r$, and $E_{r0}$ is a matrix that extracts the components of $w_r$ that correspond to $\bar{y}_0^r$. The above active index sets in $\underline{I}_r, \bar{I}_r$ are used as estimates of the set of indices of $y_r$ that are on a bound for an optimal solution to Equation (6). The CG method 715 is used to solve the following system of linear equations called a CG-linear system:

$$\tilde{M}\begin{pmatrix} \hat{\lambda} \\ \tilde{\lambda} \end{pmatrix} = \tilde{b} \qquad (22)$$

where $$\hat{\lambda} = \begin{pmatrix} \hat{\lambda}^1 \\ \vdots \\ \hat{\lambda}^{N_r} \end{pmatrix}, \tilde{\lambda} = \begin{pmatrix} \tilde{\lambda}^2 \\ \vdots \\ \tilde{\lambda}^{N_r} \end{pmatrix}, q = \begin{pmatrix} q_1 \\ \vdots \\ q_{N_r} \end{pmatrix}, b = \begin{pmatrix} b_1 \\ \vdots \\ b_{N_r} \end{pmatrix}, \qquad (23)$$

$$Q = \begin{pmatrix} Q_1 & & \\ & \ddots & \\ & & Q_{N_r} \end{pmatrix}, A = \begin{pmatrix} A_1 & & \\ & \ddots & \\ & & A_{N_r} \end{pmatrix},$$

$$E = \begin{pmatrix} E_1 & & \\ & \ddots & \\ & & E_{N_r} \end{pmatrix}, E_0 = \begin{pmatrix} E_{10} & -E_{20} & 0 & \\ E_{10} & 0 & -E_{30} & \\ \vdots & & & \ddots \\ E_{10} & & 0 & -E_{n_r 0} \end{pmatrix}$$

$$Z = \begin{pmatrix} Z_1 & & \\ & \ddots & \\ & & Z_{N_r} \end{pmatrix}, R = \begin{pmatrix} R_1 & & \\ & \ddots & \\ & & R_{N_r} \end{pmatrix},$$

$$\tilde{Q} = \begin{pmatrix} (Z_1^T Q_r Z_1)^{-1} & & \\ & \ddots & \\ & & (Z_{N_r}^T Q_{N_r} Z_{N_r})^{-1} \end{pmatrix}$$

$$\tilde{M} = \begin{pmatrix} E \\ E_0 \end{pmatrix} Z\tilde{Q}Z^T \begin{pmatrix} E^T & E_0^T \end{pmatrix}, y_R = \begin{pmatrix} (A_1 R_1)^{-1} b_1 \\ \vdots \\ (A_{N_r} R_{N_r})^{-1} b_{N_r} \end{pmatrix}$$

$$\tilde{b} = -\begin{pmatrix} E\hat{y} \\ 0 \end{pmatrix} + \begin{pmatrix} E \\ E_0 \end{pmatrix}(Ry_R - Z\tilde{Q}Z^T(q+QRy_R)).$$

The full solution $y^{cg}, \lambda^{cg}$ can be obtained as $$y^{cg} = Ry_R - Z\tilde{Q}Z^T\begin{pmatrix} E^T & E_0^T \end{pmatrix} - Z\tilde{Q}Z^T(q+QRy_R) \qquad (24)$$

$$\lambda_1^{cg} = \begin{pmatrix} E_1^T \hat{\lambda}^1 \\ \sum_2^{N_r} \tilde{\lambda}^r \end{pmatrix}, \lambda_r^{cg} = \begin{pmatrix} E_r^T \hat{\lambda}^r \\ \tilde{\lambda}^r \end{pmatrix} \forall r=2,\ldots,N_r.$$

Check for Violation of Multiplier Sign

The solution $(y^{cg}, \lambda^{cg})$ is the optimal of Equation (6). Given a solution from the CG method, the solution is checked 720 to determine if all multipliers are of the correct sign by. The violated indices are found by $$\underline{I}_r^{viol} = \{i \in \underline{I}_r | \lambda_{r,i} < 0\}, \bar{I}_r^{viol} = \{i \in \bar{I}_r | \lambda_{r,i} > 0\}.$$

If the set $\underline{I}^{viol} \cup \bar{I}^{viol} \neq \emptyset$, then the active index sets $\underline{I}_r, \bar{I}_r$ are updated 722 as, $$\underline{I}_r = \underline{I}_r \setminus \underline{I}_r^{viol}, \bar{I}_r = \bar{I}_r \setminus \bar{I}_r^{viol}.$$

If no such multiplier indices are found, then the obtained CG solution is checked 725 to see if it makes progress toward solving Equation (6). If sufficient progress is not made then, then the CG solution is discarded 730 and the procedure stops 750 and returns to the ADMM restarting from the previous ADMM iteration value.

Otherwise, check 735 of the termination condition is satisfied, and if yes, use 745 the CG solution to restart the ADMM and go to step 750, and otherwise, select 740 the CG solution as a starting guess and continue the CG iterations. Namely, the iterates with superscripts $^{cg,1}$ and $^{cg,2}$ are used in 151 and 171.

To do this, two iterations of the ADMM procedure are performed as follows, $$w^{cg} = \mathbb{P}_Y(y^{cg} - \lambda^{cg}/\beta)$$

$$(y^{cg,1}, w^{cg,1}, \lambda^{cg,1}) = \text{ADMM}(y^{cg}, w^{cg}, \lambda^{cg}/\beta)$$

$$(y^{cg,2}, w^{cg,2}, \lambda^{cg,2}) = \text{ADMM}(y^{cg,1}, w^{cg,1}, \lambda^{cg,1})$$

$$v^{cg,1} = y^{cg,1} - \lambda^{cg}, v^{cg,2} = y^{cg,2} - \lambda^{cg,1}$$

Check for Progress Towards Solution of StQP

The condition checked for sufficient progress is, $$\|v^{cg,2} - v^{cg,1}\| \leq (1-\eta)\|v^j - v^{j-1}\|,$$

where $\eta \ll 1$ is a constant. If sufficient progress is made towards an optimal solution then, ADMM iterates are updated as, $$(y^j, w^j, \lambda^j) = (y^{cg,2}, w^{cg,2}, \lambda^{cg,2})$$

$$(y^j, w^j, \lambda^j) = (y^{cg,2}, w^{cg,2}, \lambda^{cg,2})$$

$$v^j = v^{cg,2}, v^{j-1} = v^{cg,1}, \lambda = \beta\lambda^{cg,2}.$$

Namely, the iterates with superscripts $^{cg,1}$ and $^{cg,2}$ are used in 151 and 171. If the termination conditions are satisfied then the ADDM-CG process 700 is terminated. If not, more CG iterations are performed using the computed CG iterates as initial solution 740. The procedure is designed so that after the correct set of active indices are found, then the ADDM-CG process is used to compute the solution to Equation (6) and ADMM iterations are not used.

In the Appendix, pseudocode for the CG-based ADMM procedure is provided as Algorithm 1. Pseudocode for the CG process is provided in Algorithm 2, and pseudocode for finding indices of multipliers with the incorrect sign is provided as Algorithm 3.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

APPENDIX

Algorithm 1: $(y^j, w^j, \lambda^j) = \text{ADMM-CG}(y^j, w^j, \lambda^j, v^j, v^{j-1})$

| Data: | ADMM iterate $(y^j, w^j, \lambda^j)$, $v^j$ and $v^{j-1}$ |
| | Active-set identification tolerance $\epsilon^{act}$, |
| | Convergence tolerance $\epsilon$ |
| | Maximum number of CG iterations $n^{cg, max}$, |
| | Sufficient decrease constant $\eta \ll 1$. |
| | ADMM parameter $\beta$, |
| 1 | Set $j = 0$, flag = 0, resolvecg = 1 |
| 2 | Define the active index sets as in (21) |

APPENDIX-continued

Algorithm 1: $(y^j, w^j, \lambda^j) = \text{ADMM-CG}(y^j, w^j, \lambda^j, v^j, v^{j-1})$

| 3 | Set $\lambda = \beta\lambda^j$ |
| 4 | while flag == 0 do |
| 5 |    while resolvecg == 1 do |
| 6 |      Call $(y^{cg}, \lambda^{cg}) = \text{CG}(\underline{I}, \overline{I}, \lambda, n^{cg, max}, \epsilon)$ |
| 7 |      Call $(\underline{I}^{viol}, \overline{I}^{viol}) = \text{FindViolations}(y^{cg}, \lambda^{cg})$ |
| 8 |      if $(\underline{I}^{viol} = \emptyset$ and $\overline{I}^{viol} = \emptyset)$ then |
| 9 |        Set resolvecg == 0 |
| 10 |      else |
| 11 |        Set $\underline{I}_r = \underline{I}_r \backslash \underline{I}_r^{viol}, \overline{I}_r = \overline{I}_r \backslash \overline{I}_r^{viol}$ |
| 12 |      end |
| 13 |    end |
| 14 |    Set $w^{cg} = \mathbb{P}_Y(y^{cg} - \lambda^{cg}/\beta)$ |
| 15 |    $(y^{cg,1}, w^{cg,1}, \lambda^{cg,1}) = \text{ADMM}(y^{cg}, w^{cg}, \lambda^{cg}/\beta)$ |
| 16 |    $(y^{cg,1}, w^{cg,2}, \lambda^{cg,2}) = \text{ADMM}(y^{cg,1}, w^{cg,1}, \lambda^{cg,1})$ |
| 17 |    Set $v^{cg,1} = y^{cg,1} - \lambda^{cg}, v^{cg,2} = y^{cg,2} - \lambda^{cg,1}$ |
| 18 |    if $\|v^{cg,2} - v^{cg,1}\| \leq (1-\eta)\|v^j - v^{j-1}\|$ then |
| 19 |      Set $(y^j, w^j, \lambda^j) = (y^{cg,2}, w^{cg,2}, \lambda^{cg,2})$ |
| 20 |      Set $(y^j, w^j, \lambda^j) = (y^{cg,2} = w^{cg,2}, \lambda^{cg,2})$ |
| 21 |      Set $v^j = v^{cg,2}, v^{j-1} = v^{cg,1}, \lambda = \beta\lambda^{cg,2}$ |
| 22 |      if Termination conditions satisfied with $(y^{cg,1}, w^{cg,1}, \lambda^{cg,1})$, |
| |      $(y^{cg,2}, w^{cg,2}, \lambda^{cg,2})$ then |
| 23 |        flag = 1 |
| 24 |      end |
| 25 |    else |
| 26 |      flag = 1 |
| 27 |    end |
| 28 | end |

Algorithm 2: $(y^{cg}, \lambda^{cg}) = \text{CG}(\underline{I}, \overline{I}, \lambda, n^{cg, max}, \epsilon)$

| 1 | Form $\tilde{M}, \tilde{b}$ as given in (23) |
| 2 | Set $x_0 = \begin{pmatrix} E \\ E_0 \end{pmatrix} \lambda$ |
| 3 | Set $r_0 := \tilde{b} - \tilde{M}x_0, p_0 := r_0, k := 0$ |
| 4 | while $\|r_k\| > \epsilon$ and $k < n^{cg, max}$ do |
| 5 |    Set $\alpha_k := \dfrac{r_k^T r_k}{p_k^T \tilde{M} p_k}$ |
| 6 |    Set $x_{k+1} := x_k + \alpha_k p_k$ |
| 7 |    Set $r_{k+1} := r_k - \alpha_k \tilde{M} p_k$ |
| 8 |    Set $\beta_k := \dfrac{r_{k+1}^T r_{k+1}}{r_k^T r_k}$ |
| 9 |    Set $p_{k+1} := r_{k+1} + \beta_k p_k$ |
| 10 |    Set $k := k + 1$ |
| 11 | end |
| 12 | Compute $(y^{cg}, \lambda^{cg})$ using (24). |

Algorithm 3: $(\underline{I}^{viol}, \overline{I}^{viol}) = \text{FindViolations}(y, \lambda)$

| 1 | for $r = 1, \ldots, N_r$ do |
| 2 |    Set $\underline{I}_r^{viol} = \{i \in \underline{I}_r \mid \lambda_{r,i} < 0\}$ |
| 3 |    Set $\overline{I}_r^{viol} = \{i \in \overline{I}_r \mid \lambda_{r,i} > 0\}$ |
| 4 | end |

We claim:

1. A method for controlling a machine by solving a stochastic quadratic program (StQP), wherein the StQP enumerates scenarios, wherein the StQP is multi-stage, stochastic and convex, wherein constraints of the StQP include a set of linear equalities for each scenario, a set of linear inequalities for each scenario, a set of non-anticipativity constraints for the scenarios, wherein the solving uses non-anticipativity constrained variables for each scenario and an Alternating Direction Method of Multipliers (ADMM) wherein the ADMM is applied to a model predictive controller (MPC) for a machine governed by a dynamical system, wherein variables of the StQP indicating desired behavior of the machine include a linear subspace constrained variable vector and a set constrained variable vector, wherein constraints include the set of linear inequalities in each scenario and the set of non-anticipativity constraints on the non-anticipativity constrained variables, comprising:
- solving, using a processor, the linear subspace constrained variable vector while keeping the set constrained variable vector fixed using an optimal step size for each scenario and a Lagrangian multiplier;
- solving, using the processor, the set constrained variable vector while keeping linear subspace constrained variable vector fixed using the optimal step size and the Lagrangian multiplier, wherein the non-anticipativity constrained variables satisfies the set of non-anticipativity constraints for the scenarios;
- updating the Lagrangian multiplier;
- repeating for a next iteration of the StQP until either a termination condition for a feasible solution is satisfied or a termination condition for an infeasible solution is satisfied to produce a StQP solution,
  wherein the StQP uses the ADMM with a conjugate gradient (CG) process (ADMM-CG), wherein the ADMM-CG is called after a predetermined number of iterations, further comprising:
- identifying a subset of linear inequalities that hold as equalities at a solution;
- performing the predetermined number of iterations of the CG process on a CG-linear system;
- performing 2 iterations of ADMM using the solution identified by CG process to determine if sufficient progress is made toward solving StQP;
- if sufficient progress is achieved, continuing with additional CG interations, and if sufficient progress is not achieved, then terminating the CG process; and
- controlling the machine using the StQP solution.

2. The method in claim 1 where the StQP is solved for each scenario, wherein the dynamical system depends on uncertain parameters.

3. The method of in claim 1 where the StQP uses the ADMM with a conjugate gradient (CG) process (ADMM-CG), wherein the ADMM-CG is called after a predetermined number of iterations, further comprising:
- identifying the subset of linear inequalities in the convex set that are expected hold as equalities at a solution;
- performing the predetermined number of iterations of the CG process on the CG-linear system;
- checking if all the multipliers for the identified set of linear inequalities are of the correct sign;
- if there exists multipliers that are not of the correct sign, then such linear inequalities are removed from the step and the CG iterations are repeated until all multipliers in such identified are of a correct sign or the set of identified linear inequalities is empty;
- performing 2 iterations of ADMM using the solution identified by CG process to determine if sufficient progress is made toward solving StQP;
- if sufficient progress is achieved, continuing with additional CG interations, and if sufficient progress is not achieved, then terminating the CG process.

4. The method in claim 1, wherein the optimal step size for each scenario is determined as a square root of a product of minimum and maximum eigenvalues of a Hessian matrix of the scenario pre- and post-multiplied by an orthonormal basis for a null space of a linear equality constraint matrix corresponding to the scenario.

5. The method in claim 1, wherein the optimal step size is determined as a square root of a product of minimum and maximum eigenvalues of a Hessian matrix of a QP problem pre- and post-multiplied by an orthonormal basis for a null space of a linear equality constraint matrix.

6. The method of claim 1, wherein the solving for the linear subspace constrained variable vector minimizes a Lagrangian augmented quadratic objective function depending on the Lagrange multiplier, and a convex set is subject to the set of linear equality constraints and the set of inequality constraints.

7. The method of claim 1, wherein the solving for the set constrained variable vector minimizes a Lagrangian augmented quadratic objective function depending on the Lagrange multiplier and the linear subspace constrained variable vector subject to the set of linear equality constraints and the set of inequality constraints.

8. The method of claim 1, wherein the updating uses a difference between the linear subspace constrained variable vector and the set constrained variable vector multiplied by an optimal step size parameter.

9. The method of claim 1, wherein the termination condition for the feasible solution satisfies a tolerance greater than zero of a maximum of a norm of a change in the set constrained variable vector from a current value to a value at a previous iteration, and a norm of a change in the Lagrange multiplier from a current value to a value at a previous iteration.

10. The method of claim 1, wherein the termination condition for the infeasible solution checks:
- satisfaction to a tolerance greater than zero of a maximum of a normed change in the set constrained variable vector from a current value to a value at a previous iteration;
- satisfaction to a tolerance greater than zero of the normed change in the linear subspace constrained variable vector from the current value to a value at the previous iteration;
- satisfaction to a tolerance greater than 0 of an angle between a Lagrange multiplier vector and a vector resulting from a difference of the linear subspace constrained variable vector and set the constrained variable vector at the current value; and
- a difference of the linear subspace constrained variable vector and the set constrained variable vector at the current value have, element-wise, an identical sign as the Lagrange multiplier vector.

11. The method of claim 1, wherein the linear subspace constrained variable vector includes states and controls of the dynamical system, and, optionally, outputs and constrained outputs along a prediction interval, and a set constrained auxiliary variable vector of a same size as the linear subspace constrained variable vector, wherein the linear subspace constraints are equations of prediction model dynamics along the prediction interval, and the set constraints are upper bounds and lower bounds on the states and the controls, and, optionally, upper bounds and lower bounds on the output and the constrained outputs along the prediction interval.

12. The method of claim 1, wherein a number of scenarios in the StQP is one and a number of non-anticipativity constraints is zero.

13. A method for controlling a machine by solving a stochastic quadratic program (StQP), wherein the StQP enumerates scenarios, wherein the StQP is multi-stage, stochastic and convex, wherein constraints of the StQP include a set of linear equalities for each scenario, a set of linear inequalities for each scenario, a set of non-anticipativity constraints for the scenarios, wherein the solving uses non-anticipativity constrained variables for each scenario and an Alternating Direction Method of Multipliers (ADMM) wherein the ADMM is applied to a model predictive controller (MPC) for a machine governed by a dynamical system, wherein variables of the StQP indicating desired behavior of the machine include a linear subspace constrained variable vector and a set constrained variable vector, wherein constraints include the set of linear inequalities in each scenario and the set of non-anticipativity constraints on the non-anticipativity constrained variables, comprising iterative steps:
  solving, using a processor, the linear subspace constrained variable vector while keeping the set constrained variable vector fixed using an optimal step size for each scenario and a Lagrangian multiplier;
  solving, using the processor, the set constrained variable vector while keeping linear subspace constrained variable vector fixed using the optimal step size and the Lagrangian multiplier, wherein the non-anticipativity constrained variables satisfies the set of non-anticipativity constraints for the scenarios;
  updating the Lagrangian multiplier;
  repeating for a next iteration of the StQP until either a termination condition for a feasible solution is satisfied or a termination condition for an infeasible solution is satisfied to produce a StQP solution; and
  controlling the machine using the StQP solution, where the StQP uses the ADMM with a conjugate gradient (CG) process (ADMM-CG), wherein the ADMM-CG is called after a predetermined number of iterations, further comprising:
  identifying the subset of linear inequalities in the convex set that are expected hold as equalities at a solution;
  performing the predetermined number of iterations of the CG process on the CG-linear system;
  checking if all the multipliers for the identified set of linear inequalities are of the correct sign;
  if there exists multipliers that are not of the correct sign, then such linear inequalities are removed from the step and the CG iterations are repeated
until all multipliers in such identified are of a correct sign or the set of identified linear inequalities is empty;
  performing 2 iterations of ADMM using the solution identified by CG process to determine if sufficient progress is made toward solving StQP;
  if sufficient progress is achieved, continuing with additional CG interations, and if sufficient progress is not achieved, then terminating the CG process.

14. A method for controlling a machine by solving a stochastic quadratic program (StQP), wherein the StQP enumerates scenarios, wherein the StQP is multi-stage, stochastic and convex, wherein constraints of the StQP include a set of linear equalities for each scenario, a set of linear inequalities for each scenario, a set of non-anticipativity constraints for the scenarios, wherein the solving uses non-anticipativity constrained variables for each scenario and an Alternating Direction Method of Multipliers (ADMM) wherein the ADMM is applied to a model predictive controller (MPC) for a machine governed by a dynamical system, wherein variables of the StQP indicating desired behavior of the machine include a linear subspace constrained variable vector and a set constrained variable vector, wherein constraints include the set of linear inequalities in each scenario and the set of non-anticipativity constraints on the non-anticipativity constrained variables, comprising iterative steps:
  solving, using a processor, the linear subspace constrained variable vector while keeping the set constrained variable vector fixed using an optimal step size for each scenario and a Lagrangian multiplier;
  solving, using the processor, the set constrained variable vector while keeping linear subspace constrained variable vector fixed using the optimal step size and the Lagrangian multiplier, wherein the non-anticipativity constrained variables satisfies the set of non-anticipativity constraints for the scenarios;
  updating the Lagrangian multiplier;
  repeating for a next iteration of the StQP until either a termination condition for a feasible solution is satisfied or a termination condition for an infeasible solution is satisfied to produce a StQP solution, wherein the termination condition for the feasible solution satisfies a tolerance greater than zero of a maximum of a norm of a change in the set constrained variable vector from a current value to a value at a previous iteration, and a norm of a change in the Lagrange multiplier from a current value to a value at a previous iteration; and
  controlling the machine using the StQP solution.

15. A method for controlling a machine by solving a stochastic quadratic program (StQP), wherein the StQP enumerates scenarios, wherein the StQP is multi-stage, stochastic and convex, wherein constraints of the StQP include a set of linear equalities for each scenario, a set of linear inequalities for each scenario, a set of non-anticipativity constraints for the scenarios, wherein the solving uses non-anticipativity constrained variables for each scenario and an Alternating Direction Method of Multipliers (ADMM) wherein the ADMM is applied to a model predictive controller (MPC) for a machine governed by a dynamical system, wherein variables of the StQP indicating desired behavior of the machine include a linear subspace constrained variable vector and a set constrained variable vector, wherein constraints include the set of linear inequalities in each scenario and the set of non-anticipativity constraints on the non-anticipativity constrained variables, comprising iterative steps:
  solving, using a processor, the linear subspace constrained variable vector while keeping the set constrained variable vector fixed using an optimal step size for each scenario and a Lagrangian multiplier;
  solving, using the processor, the set constrained variable vector while keeping linear subspace constrained variable vector fixed using the optimal step size and the Lagrangian multiplier, wherein the non-anticipativity constrained variables satisfies the set of non-anticipativity constraints for the scenarios;
  updating the Lagrangian multiplier;
  repeating for a next iteration of the StQP until either a termination condition for a feasible solution is satisfied or a termination condition for an infeasible solution is satisfied to produce a StQP solution, wherein the termination condition for the infeasible solution checks:

satisfaction to a tolerance greater than zero of a maximum of a normed change in the set constrained variable vector from a current value to a value at a previous iteration;

satisfaction to a tolerance greater than zero of the normed change in the linear subspace constrained variable vector from the current value to a value at the previous iteration;

satisfaction to a tolerance greater than 0 of an angle between a Lagrange multiplier vector and a vector resulting from a difference of the linear subspace constrained variable vector and set the constrained variable vector at the current value; and a difference of the linear subspace constrained variable vector and the set constrained variable vector at the current value have, element-wise, an identical sign as the Lagrange multiplier vector; and controlling the machine using the StQP solution.

16. A method for controlling a machine by solving a stochastic quadratic program (StQP), wherein the StQP enumerates scenarios, wherein the StQP is multi-stage, stochastic and convex, wherein constraints of the StQP include a set of linear equalities for each scenario, a set of linear inequalities for each scenario, a set of non-anticipativity constraints for the scenarios, wherein the solving uses non-anticipativity constrained variables for each scenario and an Alternating Direction Method of Multipliers (ADMM) wherein the ADMM is applied to a model predictive controller (MPC) for a machine governed by a dynamical system, wherein variables of the StQP indicating desired behavior of the machine include a linear subspace constrained variable vector and a set constrained variable vector, wherein constraints include the set of linear inequalities in each scenario and the set of non-anticipativity constraints on the non-anticipativity constrained variables, comprising iterative steps:

solving, using a processor, the linear subspace constrained variable vector while keeping the set constrained variable vector fixed using an optimal step size for each scenario and a Lagrangian multiplier;

solving, using the processor, the set constrained variable vector while keeping linear subspace constrained variable vector fixed using the optimal step size and the Lagrangian multiplier, wherein the non-anticipativity constrained variables satisfies the set of non-anticipativity constraints for the scenarios;

updating the Lagrangian multiplier;

repeating for a next iteration of the StQP until either a termination condition for a feasible solution is satisfied or a termination condition for an infeasible solution is satisfied to produce a StQP solution, wherein the linear subspace constrained variable vector includes states and controls of the dynamical system, and, optionally, outputs and constrained outputs along a prediction interval, and a set constrained auxiliary variable vector of a same size as the linear subspace constrained variable vector, wherein the linear subspace constraints are equations of prediction model dynamics along the prediction interval, and the set constraints are upper bounds and lower bounds on the states and the controls, and, optionally, upper bounds and lower bounds on the output and the constrained outputs along the prediction interval; and controlling the machine using the StQP solution.

17. A method for controlling a machine by solving a stochastic quadratic program (StQP), wherein the StQP enumerates scenarios, wherein the StQP is multi-stage, stochastic and convex, wherein constraints of the StQP include a set of linear equalities for each scenario, a set of linear inequalities for each scenario, a set of non-anticipativity constraints for the scenarios, wherein the solving uses non-anticipativity constrained variables for each scenario and an Alternating Direction Method of Multipliers (ADMM) wherein the ADMM is applied to a model predictive controller (MPC) for a machine governed by a dynamical system, wherein variables of the StQP indicating desired behavior of the machine include a linear subspace constrained variable vector and a set constrained variable vector, wherein constraints include the set of linear inequalities in each scenario and the set of non-anticipativity constraints on the non-anticipativity constrained variables, comprising iterative steps:

solving, using a processor, the linear subspace constrained variable vector while keeping the set constrained variable vector fixed using an optimal step size for each scenario and a Lagrangian multiplier;

solving, using the processor, the set constrained variable vector while keeping linear subspace constrained variable vector fixed using the optimal step size and the Lagrangian multiplier, wherein the non-anticipativity constrained variables satisfies the set of non-anticipativity constraints for the scenarios;

updating the Lagrangian multiplier;

repeating for a next iteration of the StQP until either a termination condition for a feasible solution is satisfied or a termination condition for an infeasible solution is satisfied to produce a StQP solution, wherein a number of scenarios in the StQP is one and a number of non-anticipativity constraints is zero; and controlling the machine using the StQP solution.

18. A method for controlling a machine by solving a stochastic quadratic program (StQP), wherein the StQP enumerates scenarios, wherein the StQP is multi-stage, stochastic and convex, wherein constraints of the StQP include a set of linear equalities for each scenario, a set of linear inequalities for each scenario, a set of non-anticipativity constraints for the scenarios, wherein the solving uses non-anticipativity constrained variables for each scenario and an Alternating Direction Method of Multipliers (ADMM) wherein the ADMM is applied to a model predictive controller (MPC) for the machine governed by a dynamical system, comprising:

solving, using a processor, the StQP iteratively until either a termination condition for a feasible solution is satisfied or a termination condition for an infeasible solution is satisfied to produce a StQP solution including one or combination of values of the linear subspace constrained variable vector and the set of constrained variable vector, wherein variables of the StQP indicate desired behavior of the machine and include a linear subspace constrained variable vector subject to the constraints including the set of linear equalities for each scenario and a set constrained variable vector subject the constraints including the set of linear inequalities in each scenario for the variables excluding the non-anticipativity constrained variables and the set of non-anticipativity constraints on the non-anticipativity constrained variables, wherein each iteration comprises:

solving the linear subspace constrained variable vector while keeping the set constrained variable vector fixed using an optimal step size for each scenario and a Lagrangian multiplier;

solving the set constrained variable vector while keeping linear subspace constrained variable vector fixed using the optimal step size and the Lagrangian multiplier, wherein the non-anticipativity constrained variables satisfies the set of non-anticipativity constraints for the scenarios; and updating the Lagrangian multiplier; and controlling the machine using the StQP solution.

* * * * *